(12) United States Patent
Bhandari et al.

(10) Patent No.: US 7,809,080 B2
(45) Date of Patent: Oct. 5, 2010

(54) STRATEGICALLY SELECTING DATA CAPTURES FOR SIGNAL PREDISTORTION

(75) Inventors: Rajan Bhandari, Newbury (GB); Stephen Summerfield, Weybridge (GB); Alan Barry Christie, Swindon (GB)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 820 days.

(21) Appl. No.: 11/617,144

(22) Filed: Dec. 28, 2006

(65) Prior Publication Data

US 2008/0157870 A1  Jul. 3, 2008

(51) Int. Cl.
*H04L 25/49* (2006.01)
*H04B 1/04* (2006.01)

(52) U.S. Cl. .................... 375/296; 455/114.3

(58) Field of Classification Search ............... 375/285, 375/295–297; 455/114.2, 114.3, 115.1
See application file for complete search history.

(56) References Cited

U.S. PATENT DOCUMENTS

| | | | | |
|---|---|---|---|---|
| 5,638,403 A | * | 6/1997 | Birchler et al. | 375/296 |
| 6,570,933 B1 | * | 5/2003 | Makinen | 375/296 |
| 6,931,080 B2 | * | 8/2005 | Giardina et al. | 375/296 |
| 6,985,033 B1 | * | 1/2006 | Shirali et al. | 330/149 |
| 7,479,828 B2 | * | 1/2009 | Benedict | 330/149 |
| 2003/0031270 A1 | * | 2/2003 | Giardina et al. | 375/296 |
| 2003/0063686 A1 | * | 4/2003 | Giardina et al. | 375/296 |
| 2007/0109047 A1 | * | 5/2007 | Benedict et al. | 330/149 |

* cited by examiner

*Primary Examiner*—Khanh C Tran
(74) *Attorney, Agent, or Firm*—Carlson, Gaskey & Olds, P.C.

(57) ABSTRACT

An approach for determining corrective predistortion functions includes maintaining a history of recent estimations of a plurality of corrective predistortion functions. Each of those functions corresponds to a respective signal characteristic. By determining a feature of each of those functions from the history, one of the corrective predistortion functions is selected for a next estimation based upon which of the functions has a feature within the history that satisfies a selected criteria. In a disclosed example, the function having the lowest number of estimations within a recent history is selected as the function to have the highest priority for a next estimation.

16 Claims, 1 Drawing Sheet

STRATEGICALLY SELECTING DATA CAPTURES FOR SIGNAL PREDISTORTION

TECHNICAL FIELD

This invention generally relates to communication. More particularly, this invention relates to predistortion used for communication signal processing.

DESCRIPTION OF THE RELATED ART

Nonlinear components such as amplifiers along a wireless communication transmitter path tend to introduce various forms of distortion. One technique for compensating for or cancelling out any such distortion includes adding a distortion component to the transmitted signal. Such an added component is typically introduced in a transmit path prior to the component responsible for the distortion. Accordingly, such techniques are commonly referred to as predistortion.

The compensating predistortion component may be added in a digital domain or an analog domain. Analog predistortion performance is limited because it is not variable once set for a component and therefore has an associated cost that is tied to the cost of radio frequency components. It is generally considered advantageous to include a predistortion function in a digital domain so that it can be shared over several components such as amplifiers. Additionally, predistortion functions in the digital domain have an associated cost tied to the less expensive cost of digital processing.

Various methods for calculating a predistortion function are known. One commonly used approach includes a sampled data digital predistortion system. This approach includes a feedback path from a distorting component output so that the output from the distorting component and the desired transmitted signal can be compared. An appropriate predistortion function is based upon the comparison and applied digitally to the transmitted signal. There are well known techniques for determining such predistortion functions.

In some approaches the predistortion function is calculated during transmission of a specially designed training signal. One advantage to using such a training signal is that it can be stepped to specific power levels and can introduce a specific amount of noise. The sampled signals therefore tend to provide reliable information for determining a predistortion function. A disadvantage associated with such a test signal is that it is not desirable to introduce such power and noise levels into a system that is being used for live wireless communications. It is necessary to periodically update a predistortion function to compensate for component aging and temperature or other drift effects so something typically is done on an ongoing basis.

One approach includes sampling existing conditions such as transmitted signals used during actual communications. Such signals can vary in different manners (e.g., power level) such that the data samples may not be useful or desirable for deriving coefficients to be used in a predistortion function. In some instances, it is not possible to sample enough data to reliably update a predistortion function.

The coefficients required to achieve good linearity will depend on factors that change with time. These may include environmental, with temperature being most significant, or signal conditions. For mobile communications, the instantaneous signal changes at a rate dependent on the channel bandwidth. Additionally, there are power envelopes within a range of time scales from tens of microseconds up to many seconds. Additionally, spectral content and signal statistics may vary. In general, for acceptable performance, the predistortion function has to track such changes. Therefore, the coefficients that are applied need to change with time. Therefore, the periodic updates are required.

The rate at which the coefficients need to be updated is related to fundamental time constants for the predistortion function. These will in general depend on the amplifier or other component that introduces the distortion and the nature of the signal. In principal, the time constant reflects the scale over which the average signal condition should guide the evolution of the predistortion coefficients. In general, time constants lie in the range from 50 milliseconds to 5 seconds. These time constants depend on amplifier technology and a latency of environmental conditions.

Updating the coefficients at a required rate through repeated signal sampling (e.g., capture) and estimation may require considerable processing resources in many examples. Some approaches include using stored tables for various signal conditions that may be encountered.

In some examples, the stored tables for the signal conditions are established by monitoring signal conditions over time. For example, every T seconds, the predistortion function is updated in response to a determined signal condition such as measured power with a set of stored coefficients relative to that power. At the same time, new coefficients are calculated every W seconds and stored in the table relevant to the power at the time of sample capture. This keeps the table entries up-to-date. The number of functions that are stored is typically based on the transfer function of the distorting component, which can be arrived at empirically or through a model.

One difficulty associated with such systems is that without some form of pre-training, during initial operation conditions, the tables will contain no functions that apply to the distorting component. Only when new signal conditions (e.g., powers) are encountered can the predistortion functions be developed and stored in the table for later activation.

In typical arrangements, every W seconds, a capture occurs and then coefficients are based on that capture. This approach can result in less than optimal use of estimation resources because it depends on the behavior of the signal condition or power. For example, the instance of each capture may correspond to the same power level even though the signal power level is varying among different levels during the periods between captures. With the traditional approach, there is no ability to avoid repeatedly capturing at the same power level even though it would be useful to obtain captures at various power levels to provide a more completely populated table of coefficients and predistortion functions.

There is a need for an improved approach.

SUMMARY

An exemplary method of determining a corrective predistortion function includes determining a history of estimations of a plurality of corrective predistortion functions that each correspond to a respective signal characteristic. A feature of each of the corrective predistortion functions from the history is determined. Selecting one of the corrective predistortion functions for a next estimation is based on the selected corrective predistortion function having the determined feature that satisfies a selected criteria.

In one example, the signal characteristic comprises a signal power level.

In one example, the selected criteria comprises a number of times that each corrective predistortion function has been estimated within the determined history. One example includes selecting the corrective predistortion function for the next estimation as the one that has been estimated the least within the determined history.

An exemplary device for determining a corrective predistortion function includes a history module configured to store a history of estimations of a plurality of corrective predistortion functions that each correspond to a respective signal characteristic. An estimator is configured to determine a feature of each of the plurality of corrective predistortion functions from the history. The estimator is also configured to select one of the corrective predistortion functions for a next estimation based on the selected corrective predistortion function having the determined feature that satisfies a selected criteria.

The various features and advantages of this invention will become apparent to those skilled in the art from the following detailed description. The drawings that accompany the detailed description can be briefly described as follows.

DETAILED DESCRIPTION

Figure 1:
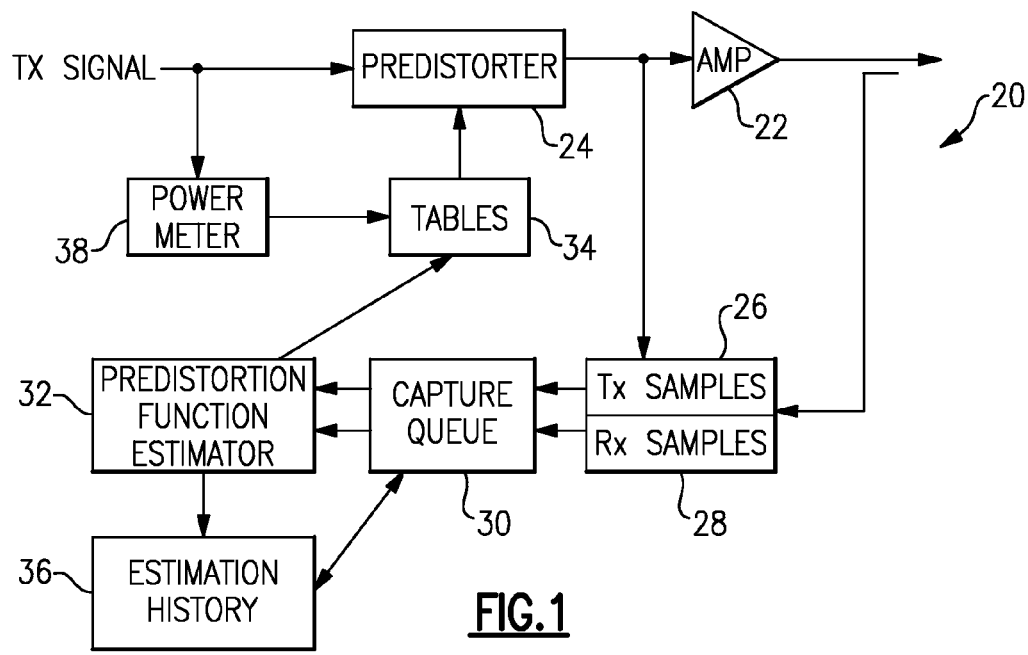
FIG. 1 schematically illustrates an example device that represents an example embodiment of this invention.

A signal processing device 20 is schematically shown in FIG. 1 including an amplifier 22. In the illustrated example, the device 20 is used for transmitting signals. The amplifier 22 is a component that tends to introduce distortion into a transmitted signal. Such a component is referred to as a distorting component in this description. A predistorter module 24 introduces predistortion into a transmitted signal before the signal reaches the amplifier 22. The predistortion is intended to compensate for or cancel out the distortion that will be introduced by the amplifier 22 such that the resulting transmitted signal corresponds to a desired signal.

The example of FIG. 1 includes sampling buffers 26 and 28 that are used for obtaining samples of signals to indicate an amount of distortion present in the signal. In the illustrated example, the buffer 26 obtains samples of the transmit signal prior to encountering the amplifier 22. The buffer 28 obtains samples of the signal after it has been processed by the amplifier 22 (e.g., a feedback sample). In some examples, the buffer 26 is referred to as a transmit sample buffer while the buffer 28 is referred to as a receive sample buffer.

Information from the sample buffers 26 and 28 is used for determining a predistortion function. In the illustrated example, a capture queue module 30 stores a plurality of capture sets from the buffers 26 and 28. In this example, the capture queue includes a plurality of capture sets, each containing a plurality of signal samples, obtained during an estimation period. One way in which the illustrated example departs from previous arrangements is that the capture sets from the buffers 26 and 28 are stored for at least some time within the capture queue module 30. Multiple capture sets are stored in this example within the capture queue module 30. With previous arrangements, the contents of the buffers 26 and 28 would be collected during a capture and then used for an estimation. There was no storage of multiple capture sets in previous arrangements.

Using multiple capture sets and being selective about which corrective predistortion function to update allows for reducing processing load. The disclosed example allows for choosing to only update corrective predistortion functions for power levels that have not been recently updated. Additionally, capturing often and having multiple capture sets allows for better identification of transients.

The illustrated example includes a predistortion function estimator module 32 that utilizes information from an acceptable capture set for determining a predistortion function in a known manner. The predistortion function estimator 32 populates a table 34 that includes a plurality of corrective predistortion functions. Each of the functions within the table 34 corresponds to a signal condition such as a signal power level.

The predistorter module 24 uses the information from the predistortion function estimator 32 and the table 34 for applying predistortion to a signal.

The illustrated example includes an estimation history module 36. Within this module, a history of estimations for each of the corrective predistortion functions indicates one or more features of each such function. In one example, the estimation history module 36 includes data regarding how many times each of the corrective predistortion functions has been estimated (e.g., updated) during the currently stored history. In one example, the estimation history module 36 maintains data regarding estimations of the predistortion functions over a period lasting at least one hour. In one example, the estimation history module 36 includes information regarding the previous M estimations where M is in a range from 100 to 500. Given this description, those skilled in the art will be able to select an appropriate length of time and amount of data to be maintained within the estimation history module 36. The predistortion function estimator module 32 utilizes information from the estimation history module 36 for selecting an appropriate one of the capture sets from within the capture queue module 30 for a next estimation of a predistortion function.

The various modules are schematically divided for discussion purposes. One or more functions of any one of them may be performed, at least in part, by another. Some examples will integrate various such modules into a single device or a single processor. The various modules of the disclosed example can be realized through software, hardware, firmware or a combination of these. Those skilled in the art who have the benefit of this description will be able to configure appropriate components and to select appropriate criteria to meet their particular needs.

One advantage to the disclosed example is that it allows for strategically selecting a capture set corresponding to a signal characteristic associated with a predistortion function that has not been estimated yet during an initialization period for the device 20. Additionally, the illustrated example provides the advantage of strategically selecting which predistortion function to estimate (e.g., update) based upon a recent history of estimations of the predistortion functions such that each of the functions can be estimated within a reasonable time to avoid any of the functions becoming "stale" relative to aging and variations in temperature, for example.

Figure 2:
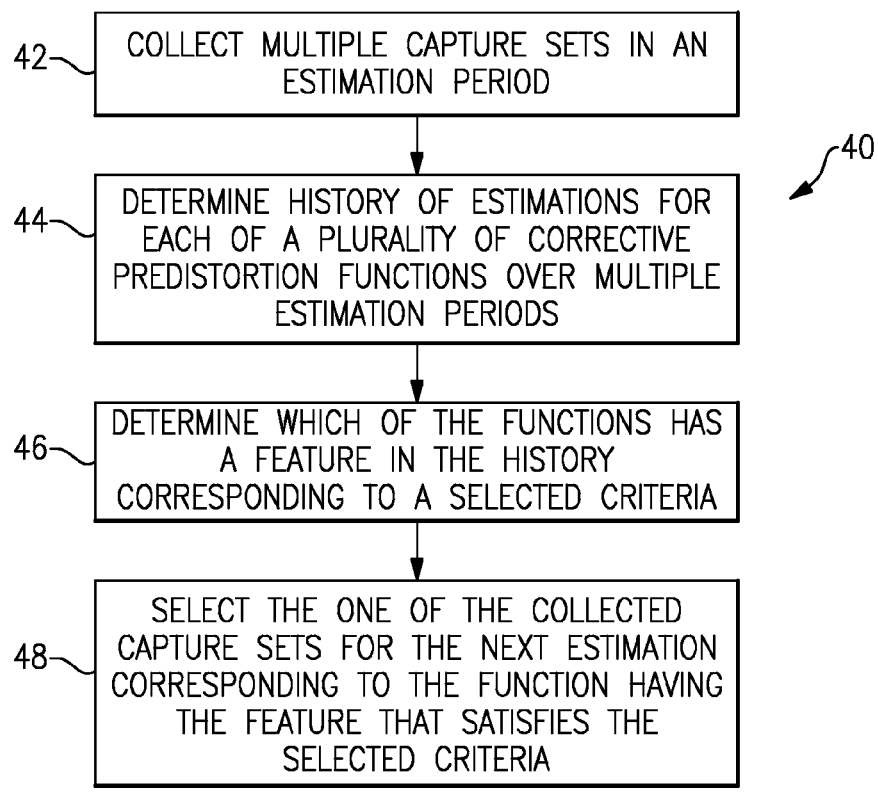
FIG. 2 is a flow chart diagram illustrating an example capture selection technique according to an embodiment of this invention.

FIG. 2 includes a flowchart diagram 40 schematically summarizing one example approach. At 42, multiple capture sets are collected during an estimation period. Each of those capture sets are initially obtained within the buffers 26 and 28 and then stored within the capture queue module 30. Each estimation period corresponds to a time such as T seconds that defines the interval at which each predistortion function estimation occurs. In one example, the power meter 38 of FIG. 1 has an associated timer function that dictates the estimation period or interval at which the table 34 is updated. In this example, multiple capture sets are acquired during each estimation period (e.g., between each estimation or update of the table 34).

At 44, the estimation history module 36 is used for determining a history of estimations for each of the plurality of corrective predistortion functions over multiple estimation periods. In this example, the history data indicates at least how many times each function has been estimated or updated.

At 46, a determination is made regarding which of the functions has a feature from the current history that corresponds to a selected criteria. In one example, the selected criteria comprises the number of times that a predistortion function has been estimated or updated during the time corresponding to the current history information. In one example, the predistortion function having the lowest number In such an example, whichever predistortion function has been estimated the least number of times will be selected for the next estimation. This is shown at 48 in FIG. 2.

The selected predistortion function will have a signal characteristic such as power that determines the function's position within the table 34, for example. The predistortion function estimator module 32 utilizes information from the estimation history module 36 and then selects a capture set from the capture queue module 30 having the signal characteristic (e.g., power level) corresponding to that of the predistortion function that has been selected for the next estimation. In this manner, a capture set is strategically selected for the next corrective predistortion function estimation based upon a recent history of estimations.

In an example where more than one predistortion function satisfies the selected historical criteria (e.g., the lowest number of recent estimations), the predistortion function estimator 32 randomly selects one of such functions for the next estimation.

The illustrated example can be used for initializing tables that are useful for predistortion. Additionally, the illustrated example can be used in an ongoing manner for facilitating more reliable predistortion function estimations over time with less processor (e.g., DSP) resource usage.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A method of determining a corrective predistortion function, comprising the steps of:
    determining a history of estimations of a plurality of corrective predistortion functions that each correspond to a respective signal characteristic;
    determining a feature of each of the plurality of corrective predistortion functions from the history; and
    selecting one of the corrective predistortion functions for a next estimation based on the selected corrective predistortion function having the determined feature that satisfies a selected criterion.

2. The method of claim 1, wherein the signal characteristic comprises a signal power level.

3. The method of claim 1, wherein the selected criterion comprises a number of times that each corrective predistortion function has been estimated within the determined history.

4. The method of claim 3, comprising
    selecting the corrective predistortion function having the lowest number of times.

5. The method of claim 1, comprising
    sampling a signal a plurality of times to obtain a plurality of capture sets each comprising a plurality of signal samples, each capture set corresponding to a corresponding one of the signal characteristics; and
    selecting the capture set corresponding to the signal characteristic of the selected corrective predistortion function for the next estimation.

6. The method of claim 5, comprising
    estimating the selected corrective predistortion using the selected capture set.

7. The method of claim 5, comprising
    obtaining the plurality of capture sets within an estimation interval;
    obtaining a new plurality of capture sets within each of a plurality of successive estimation intervals; and
    at least temporarily storing the capture sets from each estimation interval for at least the duration of the corresponding estimation interval.

8. The method of claim 7, comprising
    selecting the corrective predistortion function at the end of each of the estimation intervals.

9. A device for determining a corrective predistortion function, comprising
    a history module configured to store a history of estimations of a plurality of corrective predistortion functions that each correspond to a respective signal characteristic; and
    an estimator configured to
        determine a feature of each of the plurality of corrective predistortion functions from the history and
        select one of the corrective predistortion functions for a next estimation based on the selected corrective predistortion function having the determined feature that satisfies a selected criterion.

10. The device of claim 9, wherein the signal characteristic comprises a signal power level.

11. The device of claim 9, wherein a selected criterion comprises a number of times that each corrective predistortion function has been estimated within the stored history.

12. The device of claim 11, wherein the estimator is configured to select the corrective predistortion function having the lowest number of times.

13. The device of claim 9, wherein the estimator is configured to
    sample a signal a plurality of times to obtain a plurality of capture sets each comprising a plurality of signal samples, each capture set corresponding to a corresponding one of the signal characteristics; and
    select the capture set corresponding to the signal characteristic of the selected corrective predistortion function for the next estimation.

14. The device of claim 13, wherein the estimator is configured to estimate the selected corrective predistortion using the selected capture set.

15. The device of claim 13, wherein the estimator is configured to
    obtain the plurality of capture sets within a sampling window;
    obtain a new plurality of capture sets within each of a plurality of successive sampling windows; and
    at least temporarily store the capture sets from each sampling window for at least the duration of the corresponding sampling window.

16. The device of claim 15, wherein the estimator is configured to select the corrective predistortion function at the end of each of the sampling windows.

* * * * *